United States Patent [19]

Benecke et al.

[11] Patent Number: 5,049,460

[45] Date of Patent: Sep. 17, 1991

[54] METHOD FOR PRODUCING BEAM-SHAPING DIAPHRAGMS FOR LITHOGRAPHIC DEVICES

[75] Inventors: Wolfgang Benecke; Uwe Schnakenberg, both of Berlin; Burkhard Lischke, Munich, all of Fed. Rep. of Germany

[73] Assignee: Siemens Aktiengesellschaft, Munich, Fed. Rep. of Germany

[21] Appl. No.: 353,062

[22] Filed: May 17, 1989

[30] Foreign Application Priority Data

May 31, 1988 [DE] Fed. Rep. of Germany ....... 3818536

[51] Int. Cl.$^5$ .................................................. G03F 9/00
[52] U.S. Cl. .................................... 430/5; 430/321; 430/323; 430/324; 250/505.1; 250/492.2; 250/492.3
[58] Field of Search ............... 250/492.2 A, 492.2 B, 250/505.1; 430/5, 321, 323, 324

[56] References Cited

U.S. PATENT DOCUMENTS

| 4,417,946 | 11/1983 | Bohlen et al. | 430/313 |
|---|---|---|---|
| 4,448,865 | 5/1984 | Bohlen et al. | 430/5 |
| 4,647,517 | 3/1987 | Hersener et al. | 430/5 |
| 4,724,328 | 2/1988 | Lischke | 250/492.2 |
| 4,855,197 | 8/1989 | Zapka et al. | 430/5 |
| 4,932,872 | 6/1990 | Waggener | 430/5 |

OTHER PUBLICATIONS

Kasper, E. and Bean, J., Silicon-Molecular Beam Epitaxy, CRC Press, Inc., Boca Raton, Florida, 1988.

*Primary Examiner*—Charles L. Bowers, Jr.
*Assistant Examiner*—Thomas R. Neville
*Attorney, Agent, or Firm*—Hill, Van Santen, Steadman & Simpson

[57] ABSTRACT

Methods for producing beam shaping diaphragms for lithographic devices in which a silicon layer is epitaxially deposited on a semiconductor body and the epitaxial layer is formed in the central region as a self-supporting membrane and is formed with preferably straight line-shaped quadratic recesses which have perpendicular limiting surfaces. Photolithographic processes and galvanic second-casting techniques may be used in the process for producing the beam-shaping diaphragm. The beam-shaping diaphragm can also be produced in lightly doped epitaxial layers by using electro-chemical etching methods.

6 Claims, 7 Drawing Sheets

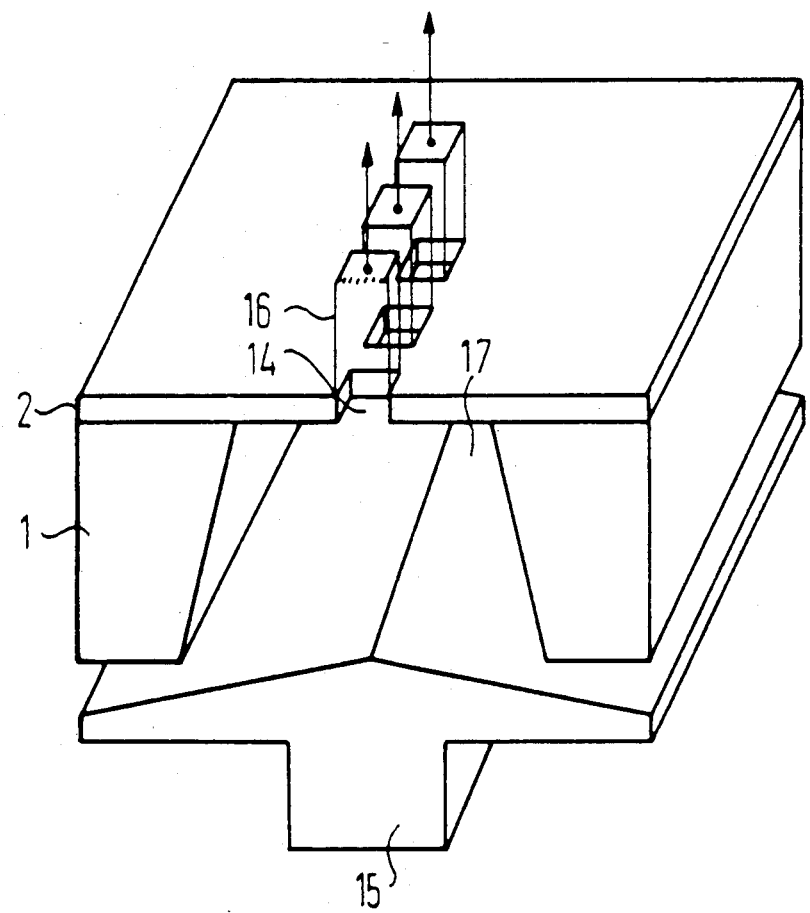

METHOD FOR PRODUCING BEAM-SHAPING DIAPHRAGMS FOR LITHOGRAPHIC DEVICES

BACKGROUND OF THE INVENTION

1. Field of the Invention

This invention relates in general to methods for producing beam-shaping diaphragms for lithographic devices.

2. Description of the Related Art

U.S. Pat. No. 4,724,328 discloses a lithographic device such as an electron beam writer which has an electron-beam optical column that includes an aperture diaphragm for producing a plurality of individually deflectable electron beam probes. This aperture diaphragm is disclosed in greater detail in European patent 0,191,439 A1 which shows a silicon membrane provided with a line-shaped multi-hole structure which has formed on its surface an electrode structure which acts as a deflection unit.

SUMMARY OF THE INVENTION

It is an object of the present invention to provide methods for producing beam-shaping diaphragms for lithographic devices in which the diaphragm receives a primary particle beam and comprises a semiconductor membrane having recesses for generating a plurality of particle beam probes.

It is an object of the invention to provide an improved method to form a beam-shaping diaphragm.

The advantage which can be obtained with the invention is that the recesses which define the beam cross-section of the particle probes can be produced with high precision.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

BRIEF DESCRIPTION OF THE DRAWINGS

FIG. 1 is a perspective view illustrating the beam-shaping diaphragm which is to be produced;

DESCRIPTION OF THE PREFERRED EMBODIMENTS

Figure 2A:
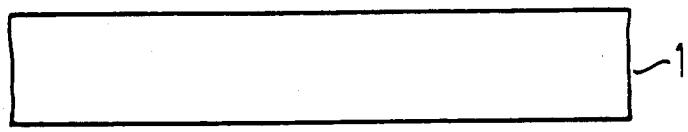
FIGS. 2a-2i illustrate a first method for forming the diaphragm of the invention.

FIG. 1 illustrates a beam-shaping diaphragm for an electron or ion beam writer which is formed from a semiconductor member 1 which has a silicon layer 2 formed on its upper surface by epitaxial deposition. The epitaxial layer 2 has a center portion which extends over an opening 17 formed in the semiconductor member 1 and a plurality of line-shaped quadratic recesses 14 having perpendicular side walls that form limiting surfaces. When the membrane 2 is charged with a primary particle beam 15, then a plurality of particle beam probes 16 which have beam cross-section which are determined by the geometry of the recesses 14 are obtained on the side opposite the particle source. The particle beam probe 16 can be subsequently deflected or blanked individually using a known aperture diaphragm and can be imaged onto a workpiece which is to be formed using a particle-optical unit.

The present invention relates to the methods for forming the beam-shaping diaphragm.

Figure 2B:
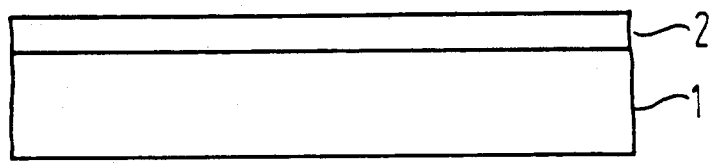

As shown in FIGS. 2a-2i: an epitaxial semiconductor layer 2 of, for example, silicon is deposited on a semiconductor substrate 1 which has a first conductivity type and, for example, may be a p-doped silicon having (1, 0, 0) or (1, 1, 0) orientation as illustrated in FIGS. 2a and 2b.

The epitaxial layer 2 is doped with boron so as to protect the epitaxial layer during later etching processes and germanium so as to reduce the mechanical stresses and the boron concentration should exceed $1 \times 10^{20}$ boron atoms/cm$^3$ and the doping is preferably accomplished during the epitaxial deposition.

Figure 2C:
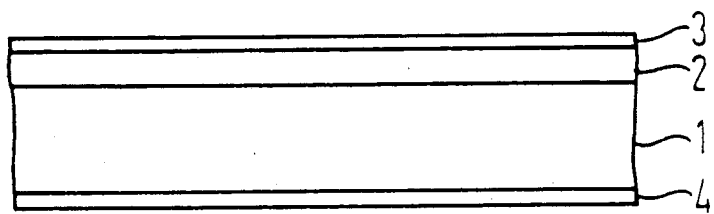

The front wafer side of the epitaxial layer 2 and the back side of the semiconductor substrate 1 are coated with a dielectric 3 and 4 which may be, for example, silicon nitride or silicon oxide as shown in FIG. 2c.

Figure 2D:
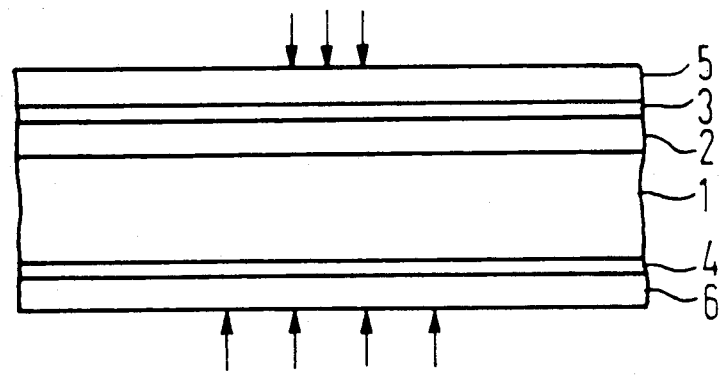

Photoresist 5 and 6 are added to the layers 3 and 4 as shown in FIG. 2d and lithographic transfer of the geometry and arrangement of the recesses 14 and the through opening 17 which is to be produced in the semiconductor substrate 1 is made on the photoresist layers 5 and 6 by exposure of onto the front wafer side and the back wafer side as shown in FIG. 2d.

Figure 2E:
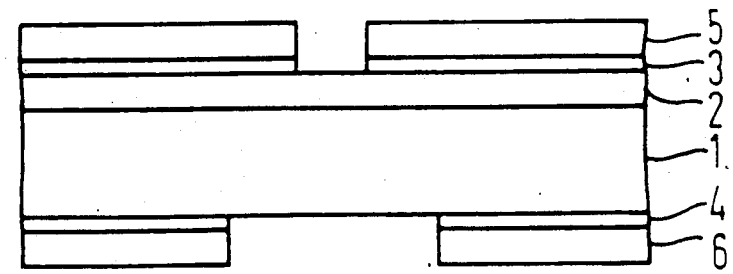

The dielectric layers 2 and 4 are reactive dry etched so as to form the openings in the layers 3 and 4 as shown in FIG. 2e. The epitaxial layer 2 is reactively dry etched as, for example, with reactive ion beam etching so as to puncture the epitaxial layer as shown in FIG. 2f. The semiconductor substrate 1 is wet chemical anistropically etched as shown in FIG. 2g.

The dielectric layers 3 and 4 are removed as shown in FIG. 2h.

Figure 2:
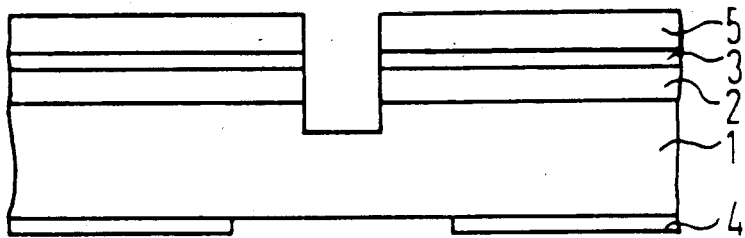
Figure 2:
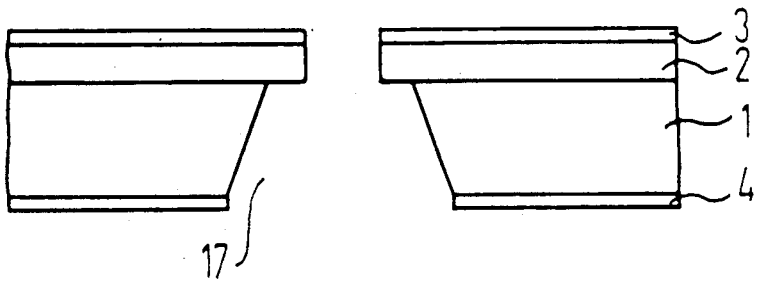
Figure 2:
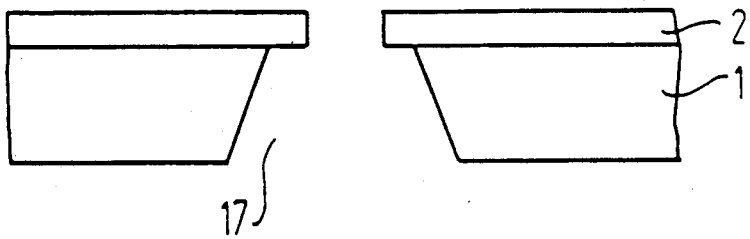
Figure 2:
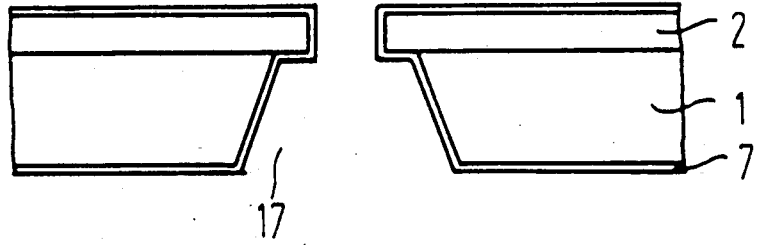
Figure 3A:
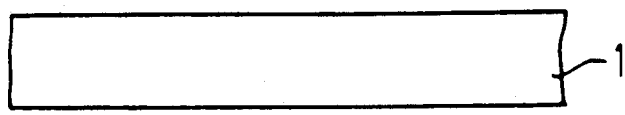
FIGS. 3a-l illustrate a modification of the method of the invention.
Figure 3B:
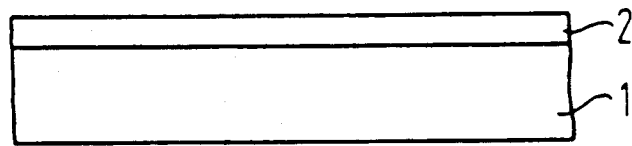
Figure 3C:
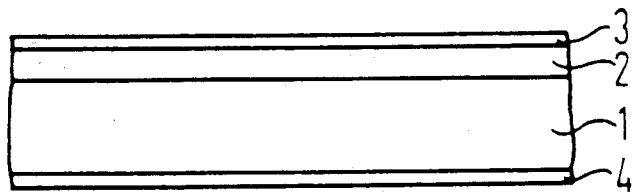

The epitaxial layer 2 and the semiconductor substrate 1 are coated with metal 7 as, for example, gold as shown in FIG. 2;

The beam-shaping diaphragm schematically illustrated in FIG. 1 can also be produced in lightly doped epitaxial layers or diffusion layers using electro-chemical etching methods. The manufacturing process for such construction comprises the following method steps which are illustrated in FIGS. 3a-3l. A semiconductor substrate 1 is illustrated in FIG. 3a and as shown in FIG. 3b, an n-doped silicon layer 2 is epitaxially deposited on the semiconductor substrate 1, which may be, for example, p-doped silicon having (1, 0, 0) or (1, 1, 0) orientation.

the front wafer side of the epitaxial layer 2 and the back wafer side of the semiconductor substrate 1 are coated with a dielectric 3 and 4 of, for example, silicon nitride or silicon oxide as illustrated in FIG. 3c.

Figure 3D:
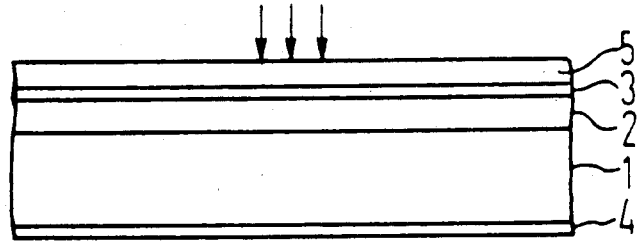

Photoresist layer 5 is formed on the dielectric layer 3 and the geometry and arrangement of the recesses 14 are lithographically transferred onto the photoresist layer which is whirled onto the dielectric 3 as shown in FIG. 3d.

Figure 3E:
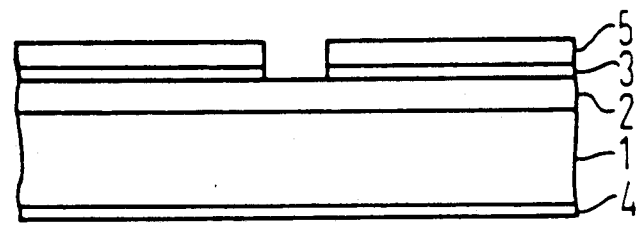
Figure 3F:
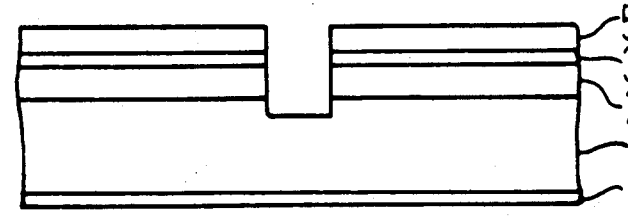
Figure 3:
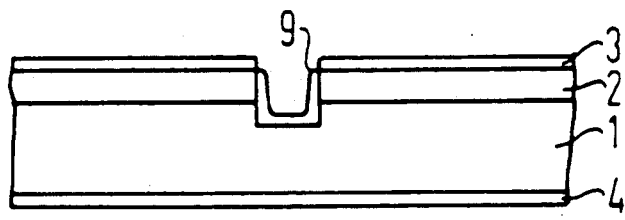
Figure 3:
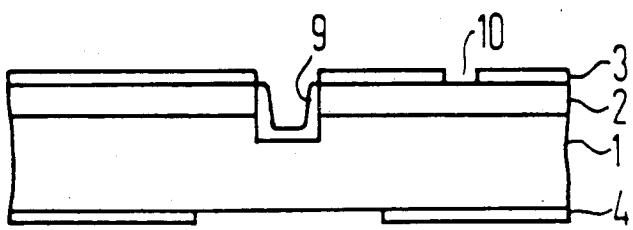
Figure 3:
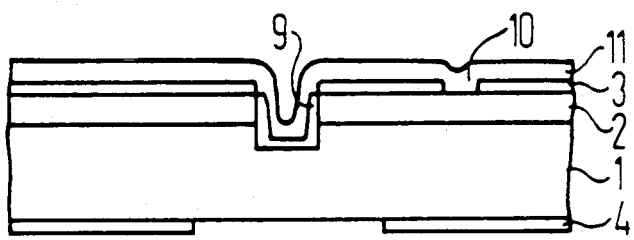
Figure 3:
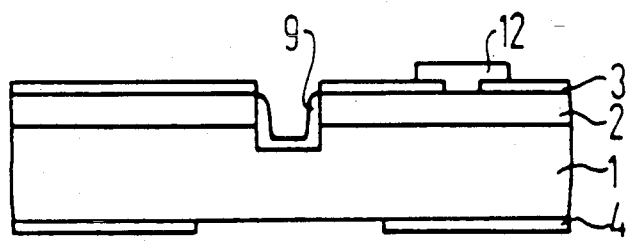
Figure 3:
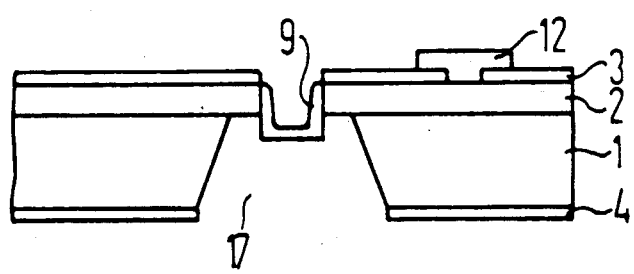
Figure 3:
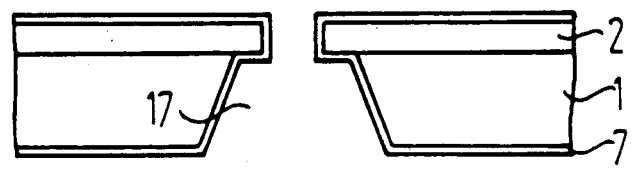

The dielectric layer 3 is reactively dry etched as shown in FIG. 3e. The epitaxial layer 2 is anisotropically dry etched as shown in FIG. 3f.

The photoresist layer 5 is removed and passivation layer 9 is deposited within the etching trenches or the oxidation surfaces exposed by the etching process as shown in FIG. 3g.

A contact window 10 is lithographically produced in the dielectric layer 3 as shown in FIG. 3h.

The geometry of the substrate is transferred with a lithographic process to form through opening 17 onto a photoresist layer which is whirled onto the dielectric layer 4 so as to form layer 4 as shown in FIG. 3h.

The front wafer side is metallized with, for example, an adhesion layer of chromium or titanium and a gold layer 11 as shown in FIG. 3i.

The metal layer 11 is cut with a lithographic process so as to produce an electrical contact 12 as shown in FIG. 3j.

The semiconductor substrate 1 is anisotropic etched, for example, with KOH using an electro-chemical etching stop so that the epitaxial layer 2 over the contact 12 is connected to the positive pole of a voltage source as shown in FIG. 3k.

The contact 12 is removed and the dielectric layers 3, 4 and 9 are removed. The substrate 1 and the epitaxial layer 2 are coated with a metal 7 as, for example, gold as shown in FIG. 3l.

Figure 4A:
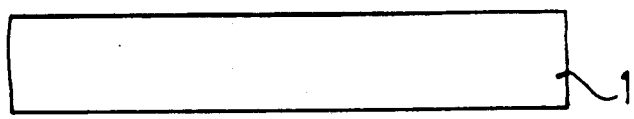
FIGS. 4a-4i illustrate a further modification of the invention.
Figure 4B:
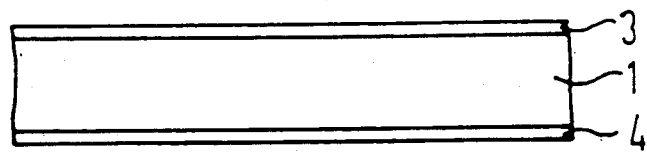
Figure 4C:
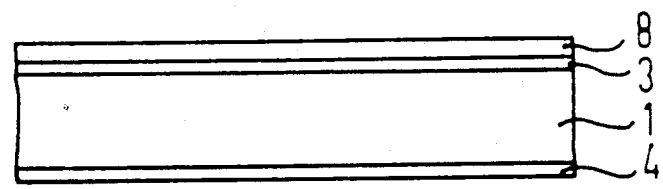
Figure 4D:
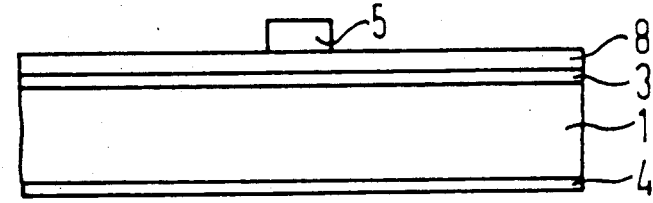
Figure 4E:
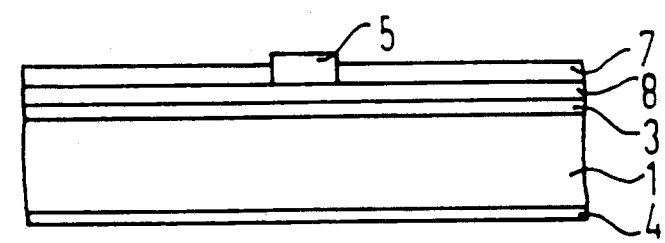
Figure 4F:
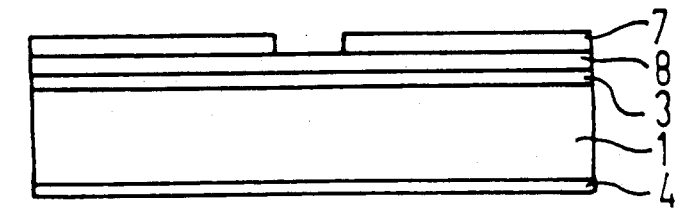
Figure 4:
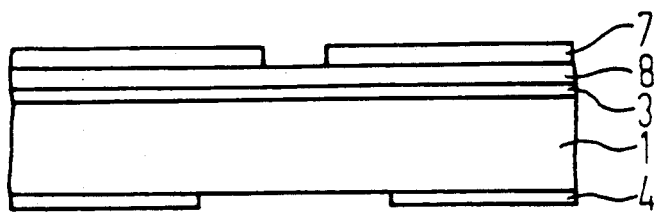
Figure 4:
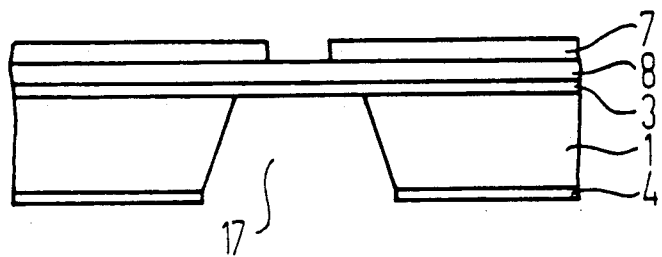
Figure 4:
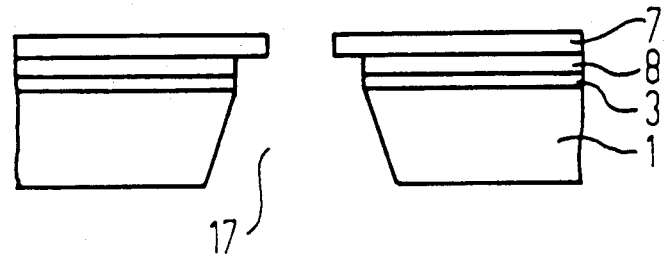

FIG. 4 illustrates a further embodiment of the invention which discloses a method using lithographic methods and galvanic second-casting.

A semiconductor substrate is shown in FIG. 4a.

On both sides of a semiconductor substrate which comprises, for example, silicon with (1, 0, 0) or (1, 1, 0) orientation are coated with dielectric layers 3 and 4 of, for example, silicon oxide or silicon nitride as illustrated in FIG. 4b.

A starter layer 8, for example, of chrome/gold or titanium/gold is applied on the front side of the wafer as shown in FIG. 4c.

The geometry and arrangement of the recesses is lithographically transferred onto a photoresist layer 5 which is whirled onto the electro-plating starter layer 8 as shown in FIG. 4d.

A metallic layer 7 is electro-deposited which might be gold onto the top wafer side as shown in FIG. 4e.

The photoresist layer 5 is removed as shown in FIG. 4f.

The passivation layer 4 is lithographically formed according to the geometry of the through-opening 17 which is to be produced in the semiconductor substrate 1 as shown in FIG. 4g.

The semiconductor substrate 1 is anisotropically wet-chemically etched on the backside as illustrated in FIG. 4h to form the opening 17.

The passivation layer 3 and the electro-plating starter layer 8 are etched int eh region of the through substrate opening 17 as shown in FIG. 4e.

It is seen that this invention provides new and novel methods for forming a beam-shaping diaphragm for a lithographic device and although it has been described with respect to preferred embodiments, it is not to be so limited as changes and modifications may be made therein as defined by the appended claims.

We claim as our invention.

1. A method for producing a beam-shaping diaphragm for a lithography device in which the beam-shaping diaphragm is charged with a primary particle beam and comprises a semiconductor membrane which has recessed for generating a plurality of particle beam probes, comprising the steps of depositing a semiconductor layer of a first conductivity type on a semiconductor substrate of a second conductivity type, applying to the semiconductor layer a first dielectric layer and applying to the back side of the semiconductor substrate a second dielectric layer, forming a pattern on the first dielectric layer of the geometry and arrangement of the recesses which are to be produced, forming pattern on the second dielectric layer of the geometry of a through opening which is to be produced in the semiconductor substrate, etching a hole through the semiconductor layer, anisotropic etching in the through opening in the semiconductor substrate, removing the dielectric layers from said semiconductor layer and said substrate, and apply a metal layer to the semiconductor layer and the semiconductor substrate, and in which the semiconductor substrate is composed of silicon which has a (1, 1, 0) orientation.

2. A method for producing a beam-shaping diaphragm for a lithography device in which the beam-shaping diaphragm is charged with a primary particle beam and comprises a semiconductor membrane which has recessed for generating a plurality of particle beam probes, comprising the steps of depositing a semiconductor layer of a first conductivity type on a semiconductor substrate of a second conductivity type, applying to the semiconductor layer a first dielectric layer and applying to the back side of the semiconductor substrate a second dielectric layer, forming a pattern on the first dielectric layer of the geometry and arrangement of the recesses which are to be produced, forming pattern on the second dielectric layer of the geometry of a through opening which is to be produced in the semiconductor substrate (1), etching a hole through the semiconductor layer, anisotropic etching in the through opening in the semiconductor substrate, removing the dielectric layers from said semiconductor layer and said substrate, and apply a metal layer to the semiconductor layer and the semiconductor substrate, and in which the semiconductor substrate is composed of silicon which has a (1, 1, 0) orientation and the semiconductor layer is doped with germanium for relieving mechanical stresses.

3. A method for producing a beam-shaping diaphragm for a lithography device, in which the beam-shaping diaphragm is charged with a primary particle beam and comprises a semiconductor membrane which has recesses for generating a plurality of particle beam probes comprising the steps of depositing a semiconductor layer of a first conductivity type on a semiconductor substrate of a second conductivity type, applying a first dielectric layer to said semiconductor layer and a second dielectric layer to said semiconductor substrate, forming a pattern on the first dielectric layer of the geometry and arrangement of the recesses to be produced, etching a hole in the semiconductor layer, depositing a passivation layer within etching trenches, forming a window in the first dielectric layer, forming a pattern on the second dielectric layer of the geometry of a through opening which is to be produced int eh semiconductor substrate, applying a first metal layer to the first dielectric layer producing an electrical contact by lithographic process from the first metal layer, producing a through opening by anisotropic etching in the semiconductor substrate using an electro-chemical etching stop, so as that the semiconductor layer over the electrical contact is connected to a pole of a voltage source, removing the dielectric layers and the electrical contact, and applying a second metallic layer to the semiconductor layer and the semiconductor substrate.

4. A method for producing a beam-shaping diaphragm for a lithography device, in which the beam-shaping diaphragm is charged with a primary particle beam and comprises a semiconductor membrane which has recesses for generating a plurality of particle beam probes, comprising the steps of applying to a semiconductor body on its front side a first dielectric layer and to its back side a second dielectric layer, applying a first metallic layer on the first dielectric layer, applying and forming a pattern of the geometry and arrangement of the recesses to be produced on a photoresist layer which is applied on the first metallic layer, electrodepositing a second metallic layer on the first metallic layer, removing the photoresist layer, forming a pattern on the second dielectric layer of the geometry of a through opening which is to be produced in the semiconductor substrate, anisotropic etching the semiconductor substrate, and removing the first dielectric layer and the first metallic layer in the region of the through opening.

5. A method according to claim 3 or 4, in which the semiconductor substrate is composed of silicon which has a (1, 0, 0) orientation.

6. A method according to claim 3 or 4, in which the semiconductor substrate is composed of silicon which has a (1, 1, 0) orientation.

* * * * *